United States Patent
Liu et al.

(10) Patent No.: US 7,573,102 B2
(45) Date of Patent: Aug. 11, 2009

(54) ESD PROTECTION STRUCTURE AND METHOD UTILIZING SUBSTRATE TRIGGERING FOR A HIGH-VOLTAGE TOLERANT PAD

(75) Inventors: Meng-Huang Liu, Hsinchu (TW); Chun-Hsiang Lai, Taichung (TW); Shin Su, Banchiau (TW); Yen-Hung Yeh, Yangmei Township, Taoyuan County (TW); Chia-Ling Lu, Lujhou (TW); Tao-Cheng Lu, Koahsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 162 days.

(21) Appl. No.: 11/496,490

(22) Filed: Aug. 1, 2006

(65) Prior Publication Data

US 2006/0273399 A1    Dec. 7, 2006

(51) Int. Cl.
*H01L 29/72* (2006.01)
(52) U.S. Cl. .......................... 257/355; 257/360; 361/56; 361/11

(58) Field of Classification Search .................. 257/355, 257/360; 361/56, 111
See application file for complete search history.

(56) References Cited

U.S. PATENT DOCUMENTS

| | | | | |
|---|---|---|---|---|
| 6,233,130 | B1 * | 5/2001 | Lin | 361/118 |
| 6,903,913 | B2 * | 6/2005 | Ker et al. | 361/111 |
| 2004/0212936 | A1 * | 10/2004 | Salling et al. | 361/56 |

* cited by examiner

*Primary Examiner*—Edward Wojciechowicz
(74) *Attorney, Agent, or Firm*—Rabin & Berdo P.C.

(57) ABSTRACT

In an ESD protection structure and method utilizing substrate triggering for a high-voltage tolerant pad on a substrate, an ESD protection device has a source connected to the pad and a gate and a drain both connected to a ground, and a substrate-triggering control circuit is used to keep the substrate at a low voltage during a normal operation, and pumping the substrate to a high voltage during an ESD event for the ESD protection device to be triggered much easier. The substrate-triggering control circuit is implemented with an active device, thereby reducing the chip size for the circuit and the loading effect on the pad.

8 Claims, 6 Drawing Sheets

ESD PROTECTION STRUCTURE AND METHOD UTILIZING SUBSTRATE TRIGGERING FOR A HIGH-VOLTAGE TOLERANT PAD

FIELD OF THE INVENTION

The present invention relates generally to an electrostatic discharge (ESD) protection for an integrated circuit (IC) and more particularly, to an ESD protection structure and method utilizing substrate triggering for a high-voltage tolerant pad on a substrate.

BACKGROUND OF THE INVENTION

Accompanied with continuous advancement of semiconductor manufacturing techniques, the element size in integrated circuits is constantly scaled down, and metal-oxide-semiconductor (MOS) transistor gradually becomes the primary element for the design of integrated circuits. However, MOS transistor has a structure more vulnerable to ESD induced failure than that of bipolar junction transistor (BJT). When a surge on the input voltage of an integrated circuit is applied to the internal circuit via a pad, it is possible to damage the MOS transistors in the internal circuit, and it is therefore an important issue for the design of an integrated circuit with an ESD protection circuit between the pad and internal circuit by which a release path for ESD current is built-up during an ESD event so as to protect the internal circuit from damage.

FIG. 1a shows a typical layout 1 of an ESD protection device, which includes a fingers structure to provide the ESD protection function. Unfortunately, the fingers of the ESD protection device in an integrated circuit are hardly to be turned on uniformly during an ESD event due to their inherent structure difference resulted from the fingers arrangement, resulting in that the ESD current will concentrates in a small region of the fingers structure and thus burns out the ESD protection device. To solve the difficulty, it has been proposed two improved ESD protection circuits 10 and 30, as shown in FIGS. 1b and 1c, respectively.

In FIG. 1b, an ESD protection circuit 10 to enhance an ESD protection device 12 connected between an input pad 24 and ground GND to be turned on uniformly during an ESD event comprises, between the input pad 24 and ground GND, an NMOS transistor 14 connected in series with a substrate resistor 16 resulted from the substrate that the integrated circuit is formed thereon, and a capacitor 18 and a resistor 20 connected in series with the node 22 therebetween connected to the control gate of the NMOS transistor 14. Once upon an ESD event, the triggering circuit composed of the capacitor 18 and resistor 20 generates a triggering signal to turn on the NMOS transistor 14, and the substrate potential is further pumped to a higher level by the substrate resistor 16, thereby enhancing the fingers of the ESD protection device 12 to be turned on uniformly.

Another ESD protection circuit 30, in FIG. 1c, for an ESD protection device 32 connected between an input pad 31 and ground GND to be turned on uniformly during an ESD event, comprises a PNP transistor 34 and a substrate resistor 36 connected between the input pad 31 and ground GND with the base of the PNP transistor 34 connected with a supply voltage VCC, and a capacitor 37 connected between the supply voltage VCC and ground GND. When an ESD event is occurred, the capacitor 37 control the timing of turning on the PNP transistor 34, and the substrate potential is further pumped to a higher level by the substrate resistor 16, thereby enhancing the fingers of the ESD protection device 32 to be turned on uniformly.

The ESD protection circuits 10 and 30 shown in FIGS. 1b and 1c both employ an RC circuit composed of passive devices to control the pumping of the substrate potential during an ESD event for the trigger voltages of the ESD protection devices 12 and 32 to be lowered. An example of such type of circuit is referred to the MOS structure with improved substrate-triggered effect for on-chip ESD protection disclosed by U.S. Pat. No. 6,465,768 issued to Ker et al. In an integrated circuit, however, passive device requires more chip area to be formed therewith and an RC circuit will increase the loading on the pad it is connected thereto.

In addition, even though conventional ESD protection circuits can enhance the ESD protection device to be easier triggered by pumping the substrate potential, they cannot be provided for the cases of the pads that will be applied with voltages thereon higher than the supply voltage VCC. Readers are referred to the PNP driven NMOS ESD protection circuit disclosed by U.S. Pat. No. 5,982,217 issued to Chen et al. and the substrate pumped ESD network with trench structure disclosed by U.S. Pat. No. 6,411,480 issued to Gauthier et al. for more details.

Therefore, it is desired an ESD protection structure and method with a high driving capability of pumping the substrate potential.

SUMMARY OF THE INVENTION

An object of the present invention is to provide an ESD protection circuit and method utilizing an active device to pump the substrate potential, thereby reducing the chip area for the circuit and the loading to the input pad it is connected.

Another object of the present invention is to provide an ESD protection circuit and method capable of applying to the pads that will be applied with voltages thereon higher than the supply voltage.

In an ESD protection circuit utilizing substrate triggering for a high-voltage tolerant pad on a substrate, according to the present invention, an ESD protection device has a source connected to the pad, and a gate and a drain grounded, a substrate resistor resulted from the substrate is connected between the substrate and ground, and a substrate-triggering control circuit connected to the pad and substrate for keeping the substrate at a low voltage during a normal operation and pumping the substrate to a high voltage during an ESD event to thereby enhance the ESD protection device to be easier triggered.

In an ESD protection method utilizing substrate triggering for a high-voltage tolerant pad on a substrate to enhance an ESD protection device connected between the substrate and ground to be easier triggered during an ESD event, according to the present invention, an active device is switched to keep the substrate at a low voltage during a normal operation and pump the substrate to a high voltage during the ESD event.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1A:
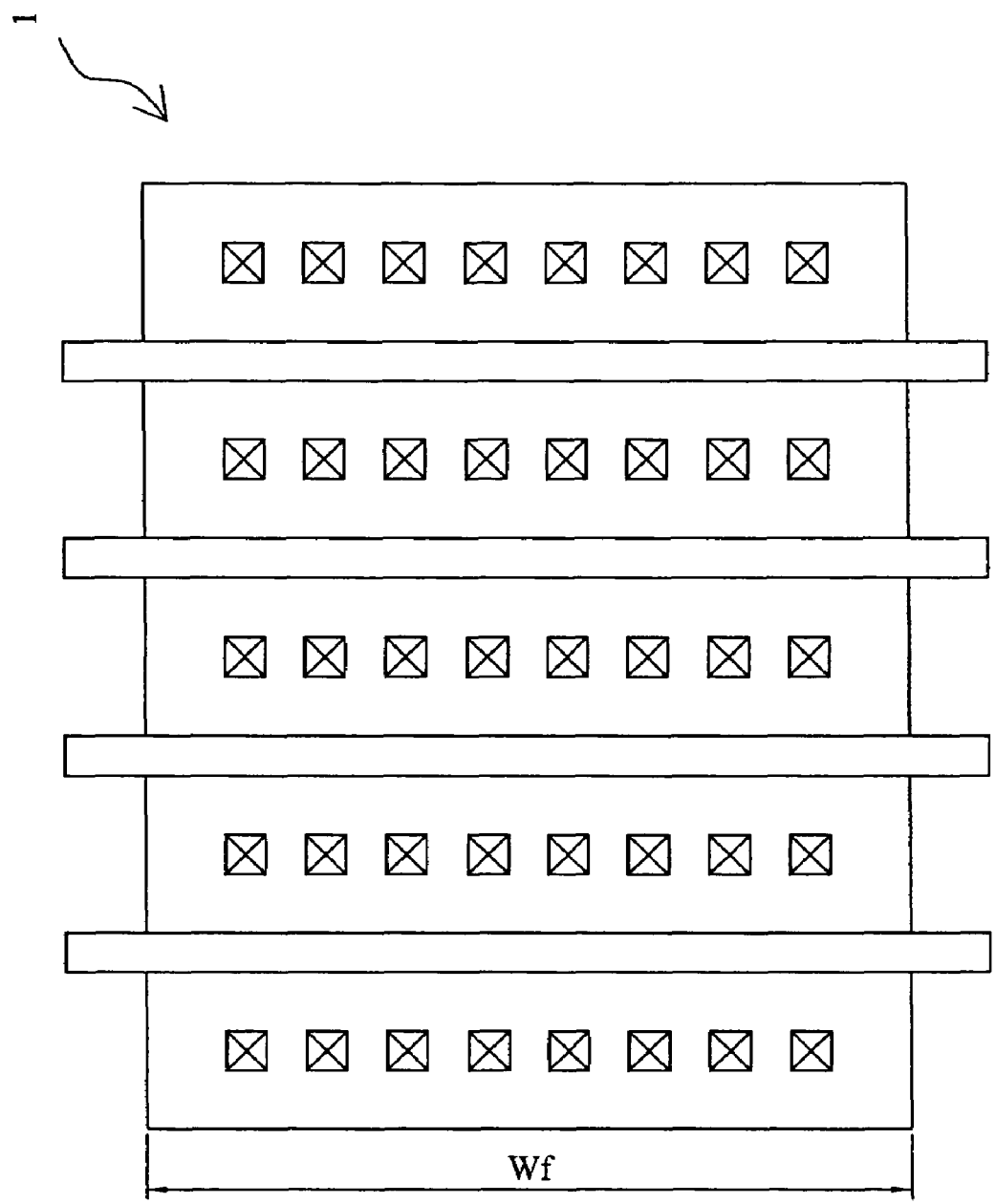
FIG. 1a shows a typical layout 1 of an ESD protection device.
Figure 1B:
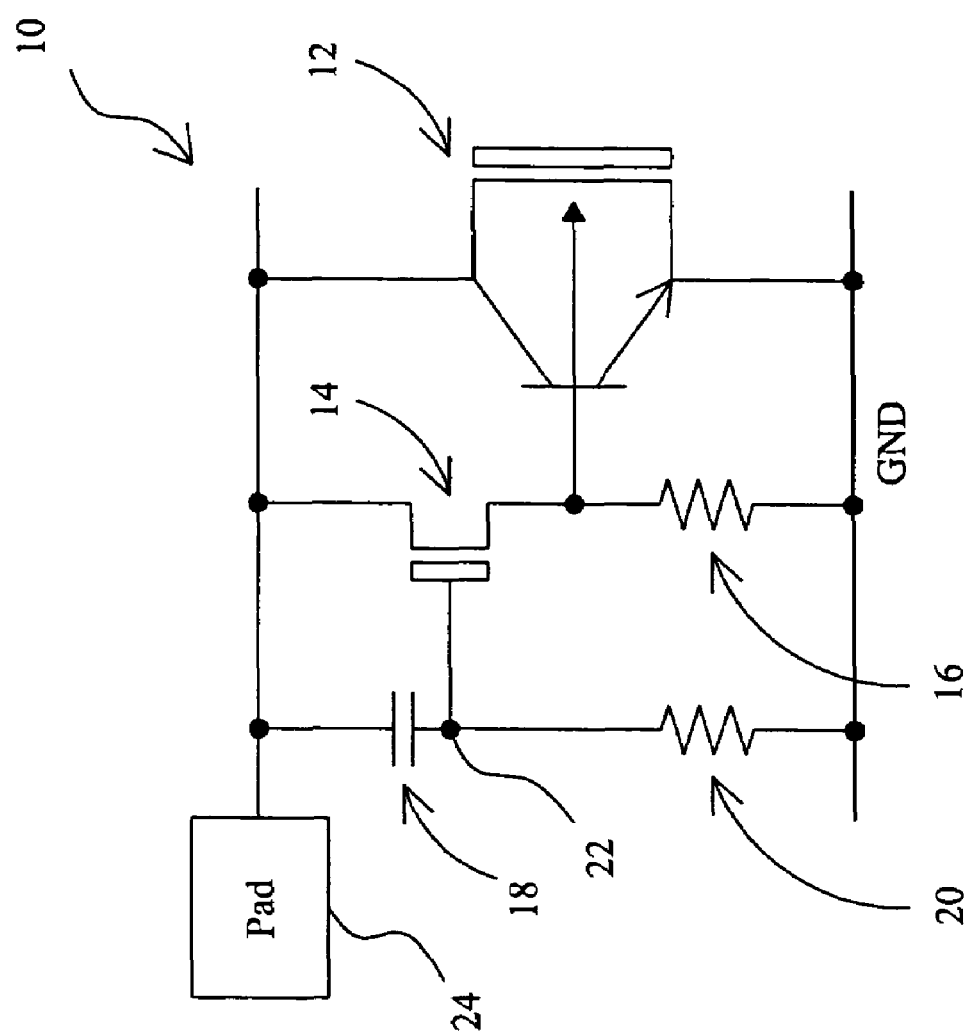
FIGS. 1b and 1c show two conventional ESD protection circuits, respectively.
Figure 1C:
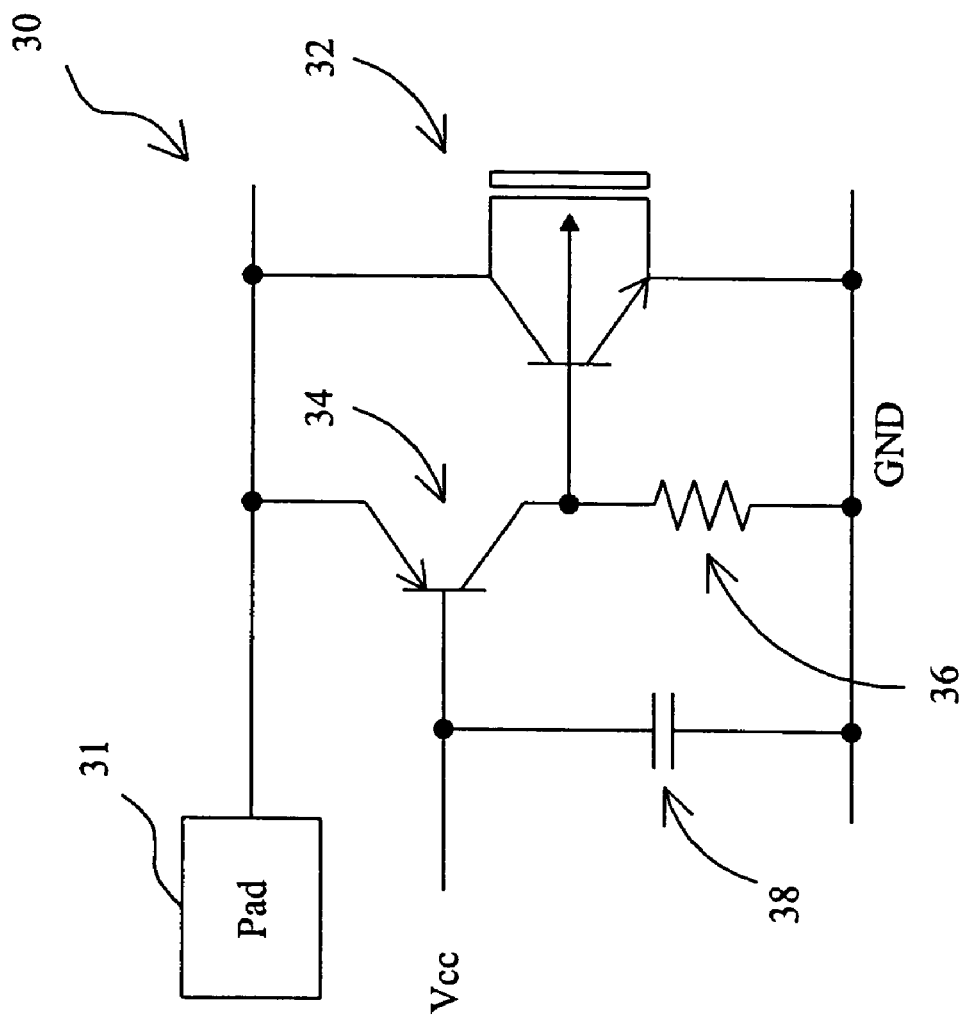
Figure 2:
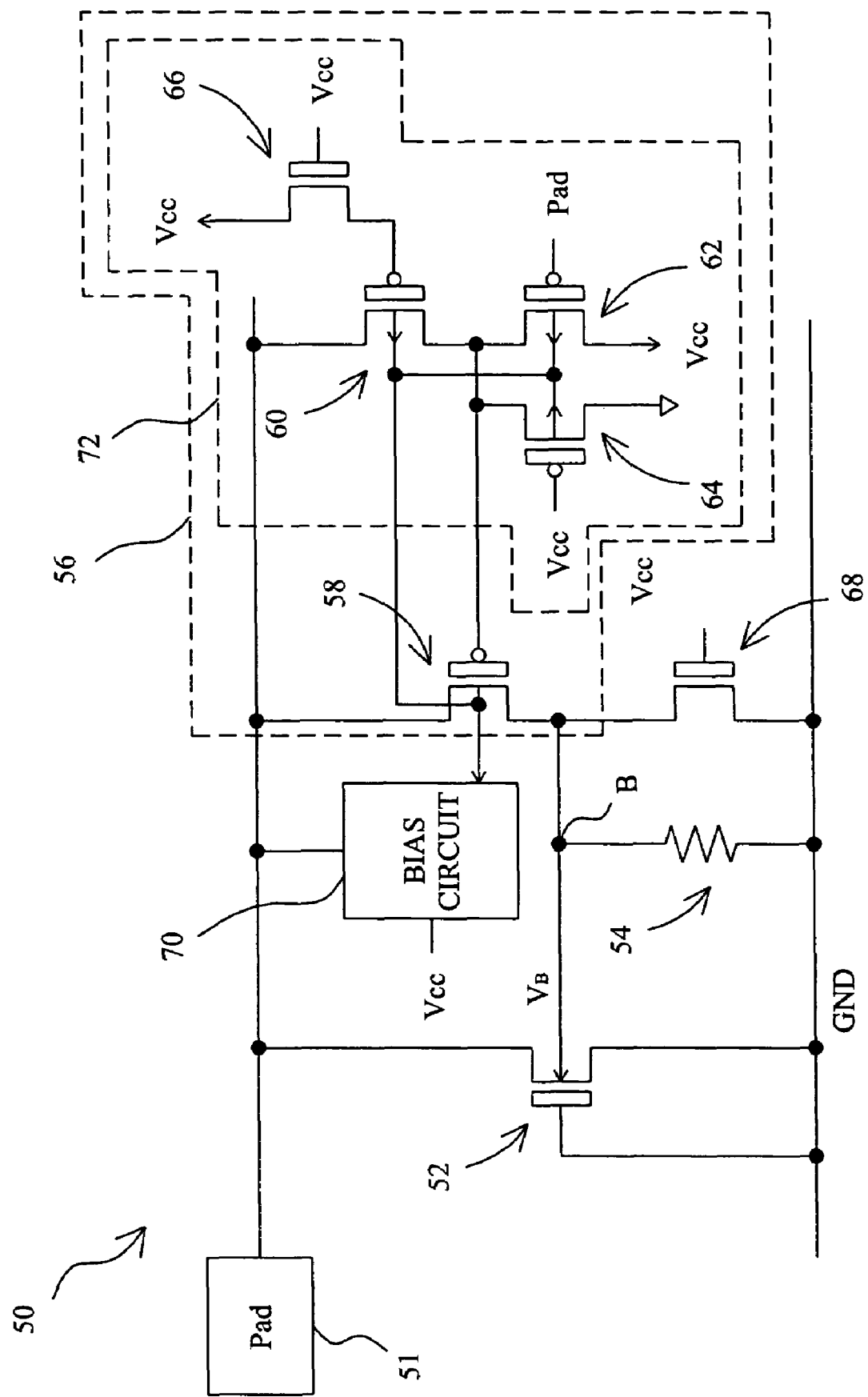
FIG. 2 shows an ESD protection circuit according to the invention.

Referring to FIG. 2 showing an ESD protection circuit 50 according to the invention connected between a pad 51 and ground GND, that comprises an ESD protection device 52 connected between the pad 51 and ground GND, and a substrate resistor 54 connected between the base of the ESD protection device 52 and ground GND. During an ESD event, the ESD protection circuit 50 pumps the substrate potential $V_B$ to a higher level by a substrate-triggering control circuit 56, so as to enhance the ESD protection device 52 to be easier turned on. The substrate-triggering control circuit 56 includes PMOS transistors 58, 60, 62 and 64, and an NMOS transistor 66. The PMOS transistor 58 has a source connected to the pad 51, and a drain connected to the base of the ESD protection device 52 with node B. The PMOS transistor 60 has a source connected to the pad 51, and a drain connected to the gate of the PMOS transistor 58. The bases of the PMOS transistors 58 and 60 both are connected to the bias circuit 70. The PMOS transistors 62 and 64 have their sources connected to the drain of the PMOS transistor 60, and the bases of them are also connected to the bias circuit 70. The drain of the PMOS transistor 62 and the gate of the PMOS transistor 64 are connected together to a supply voltage VCC. The gate of the PMOS transistor 62 is connected to the pad 51, and the drain of the PMOS transistor 64 is grounded. The NMOS transistor 66 has a drain and a gate both connected to a supply voltage VCC, and its source is connected to the gate of the PMOS transistor 60. The ESD protection circuit 50 further comprises an NMOS transistor 68, whose drain is connected to the base of the ESD protection device 52, whose source is grounded, and whose gate is connected to a supply voltage VCC, so as to release the accumulated electric charge in the transistors of the substrate-triggering control circuit 56 during the normal operation. The bias circuit 70 is connected to the pad 51 and supply voltage VCC, and is also connected to the bases of the PMOS transistor 58, 60, 62 and 64, for the pad 51 to be applied voltages larger than the supply voltage VCC under the normal operation.

In the substrate-triggering control circuit 56, the PMOS transistor 58 is switched by a detection circuit 72 composed of the PMOS transistors 60, 62 and 64 and the NMOS transistor 66. The detection circuit 72 is connected to the pad 51, supply voltage VCC and the gate of the PMOS transistor 58. During the normal operation, the detection circuit 72 turns off the PMOS transistor 58 to keep the substrate potential $V_B$ of the ESD protection device 52 at a low voltage, such that the protection device 52 is not turned on. During an ESD event, the PMOS transistor 58 is turned on to pull the substrate potential $V_B$ to a high level, such that the ESD protection device 52 is easier to be triggered, thereby accomplishing the ESD current discharging purpose.

In a method using the ESD protection circuit 50 for ESD protection, the voltage on the pad 51 is compared with the supply voltage VCC during the normal operation. When the supply voltage VCC is larger than the voltage on the pad 51, the NMOS transistor 66 provides the supply voltage VCC to the gate of the PMOS transistor 60. Due to the supply voltage VCC larger than that on the pad 51, the PMOS transistors 60 and 64 are turned off, and the PMOS transistor 62 is turned on, so that the voltage on the gate of the PMOS transistor 58 is equal to the supply voltage VCC, and thereby the PMOS transistor 58 is turned off. As a result, the voltage $V_B$ on the node B is maintained at low potential approximately to 0 V. Furthermore, the supply voltage VCC is larger than 0 V, so that the NMOS transistor 68 is turned on, by which the accumulated charges in the transistors of the substrate-triggering control circuit 56 are released, and the voltage $V_B$ on the node B will be maintained at low potential of about 0 V. When the supply voltage VCC is smaller than the voltage on the pad 51, the NMOS transistor 66 provides the supply voltage VCC to the gate of the PMOS transistor 60, and for the supply voltage VCC smaller than that on the pad 51, the PMOS transistors 62 and 64 are turned off, and the PMOS transistor 60 is turned on to provide the voltage on the pad 51 to the gate of the PMOS transistor 58, thereby turning off the PMOS transistor 58. As a result, the voltage $V_B$ on the node B is maintained at low potential of about 0 V. Under this circumstances, due to the supply voltage VCC still larger than 0 V, the NMOS transistor 68 is turned on to release the accumulated charges in the transistors of the substrate-triggering control circuit 56, and thereby to maintain the voltage $V_B$ on the node B at about 0 V. As in the foregoing illustration, during the normal operation, neither the supply voltage VCC nor the voltage on the pad 51 is able to turn on the PMOS transistor 58 to activate the ESD protection device 52. During an ESD event, a positive ESD current is impressed to the pad 51; however, no parasitic diode is presented to the supply voltage VCC in absence of PMOS devices. While a large parasitic capacitance exists between the supply voltage VCC and ground GND, and the supply voltage VCC is floating instead of biased. During the ESD event, the supply voltage VCC is clamped at about 0 V by ground potential owing to the effect of the large parasitic capacitance. When the ESD event is occurred, VCC is about 0 V, and the PMSO transistor 64 is turned on, resulting in that the source of the PMOS transistor 64 has a lower voltage than that of pad 51 and is connected to the gate voltage of the PMOS transistor 58. In this case, the voltage on the pad 51 is larger than the gate voltage of the NMOS transistor 58, and thus the PMOS transistor 58 is turned on to pump the substrate. Due to VCC at about 0 V, the PMOS transistor 68 is turned off, and the voltage $V_B$ on the node B is charged to a high potential, such that the ESD protection device 52 becomes more easily to be triggered for performing its ESD protection function.

Figure 3:
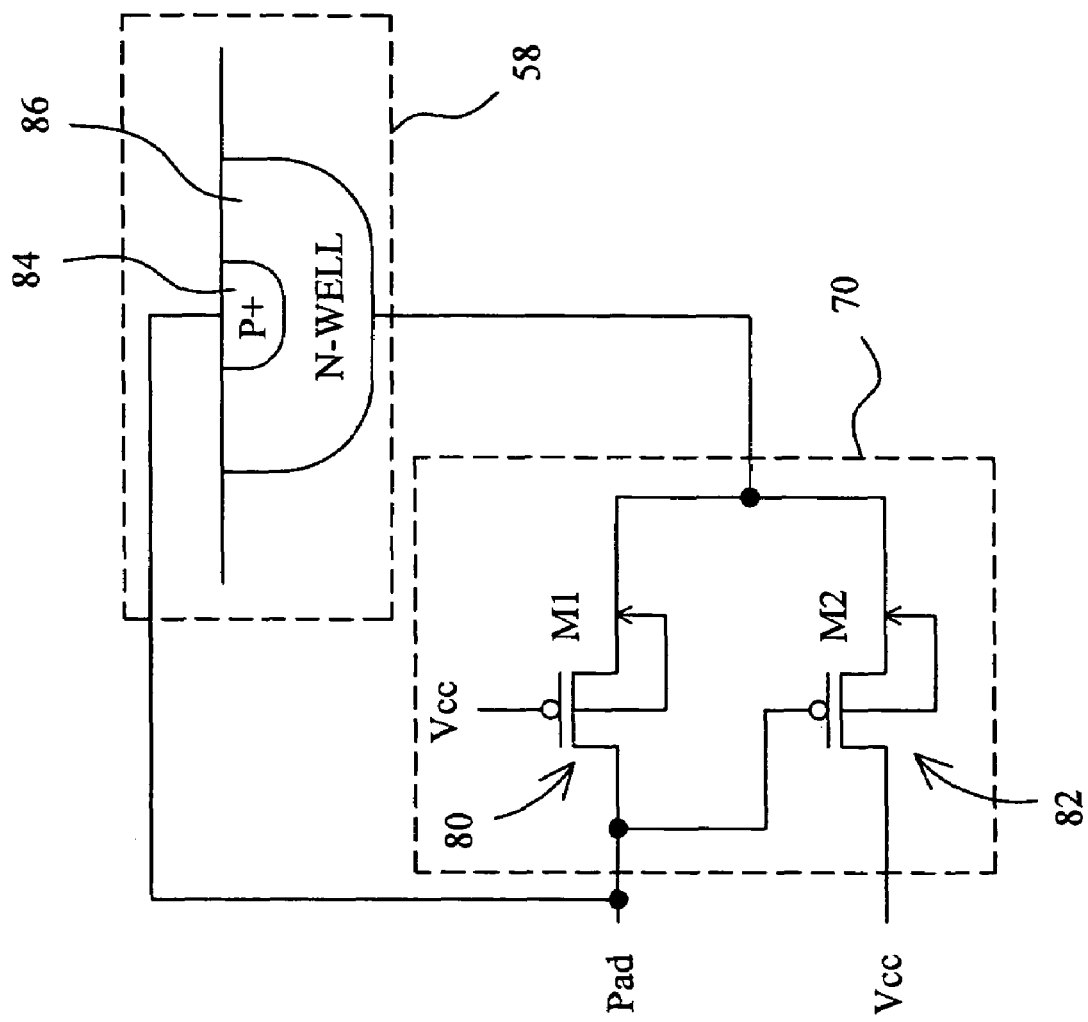
FIG. 3 shows an embodiment circuit for the bias circuit 70 shown in FIG. 2.

Referring to FIG. 2, during a normal operation, if the voltage applied to the pad 51 is larger than the supply voltage VCC, the P+/N-well junction of the PMOS transistor 58 will be forward biased, hence resulting in significant leak current. Therefore, the bias circuit 70 is provided to prevent the P+/N-well junction of the PMOS transistor 58 from forward biased. FIG. 3 shows an embodiment circuit for the bias circuit 70 shown in FIG. 2, which includes PMOS transistors 80 and 82 with the gate of the PMOS transistor 80 connected to a supply voltage VCC, its source connected to the pad 51 and a P+ region 84 of the PMOS transistor 58, and its drain connected to an N-well 86 of the PMOS transistor 58. The PMOS transistor 82 has a gate connected to the pad 51, a source connected to a supply voltage VCC, and a drain connected to the N-well 86 of the PMOS transistor 58. In the ESD protection circuit 50, during normal operations, in the case of the supply voltage VCC larger than the voltage on the pad 51, the PMOS transistor 82 is turned on and the PMOS transistor 80 is turned off, thereby the voltage on the N-well 86 is the same as the supply voltage VCC. In another case of the supply voltage VCC smaller than the voltage on the pad 51, the PMOS transistor 80 is turned on and the PMOS transistor 82 is turned off, thereby the voltage on the N-well 86 is the same as that on the pad 51. As a result, the bias circuit 70 provides a bias voltage to the N-well 86 of the PMOS transistor 58 during the normal operations, so as to prevent the P+/N-well junction of the PMOS transistor 58 from forward biased, thereby prohibiting significant leak current generated thereof.

Figure 4A:
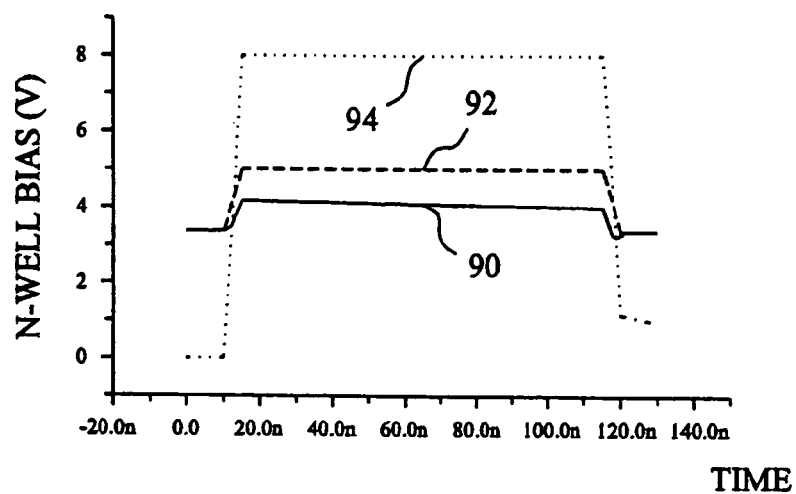
FIGS. 4a-4c show waveform diagrams illustrating the bias voltage on the N-well 86 of the PMOS transistor 58, the current on the pad 51 and the voltage on the node B measured under a same set of parameters.
Figure 4B:
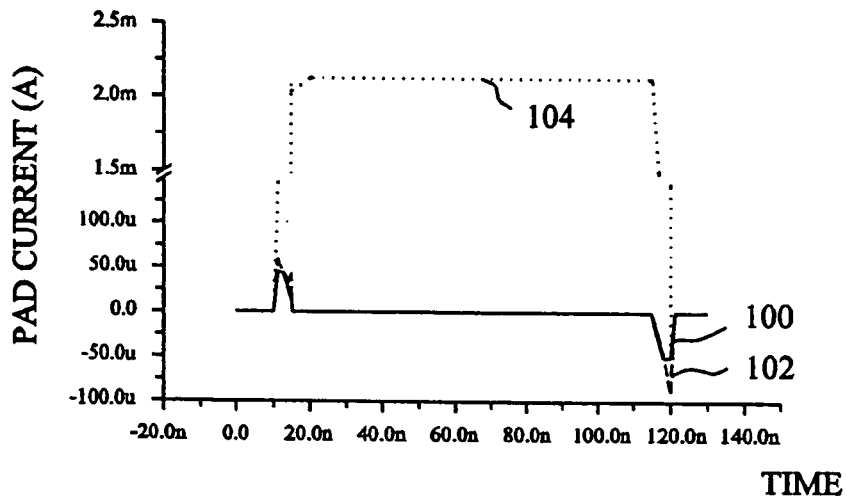
Figure 4C:
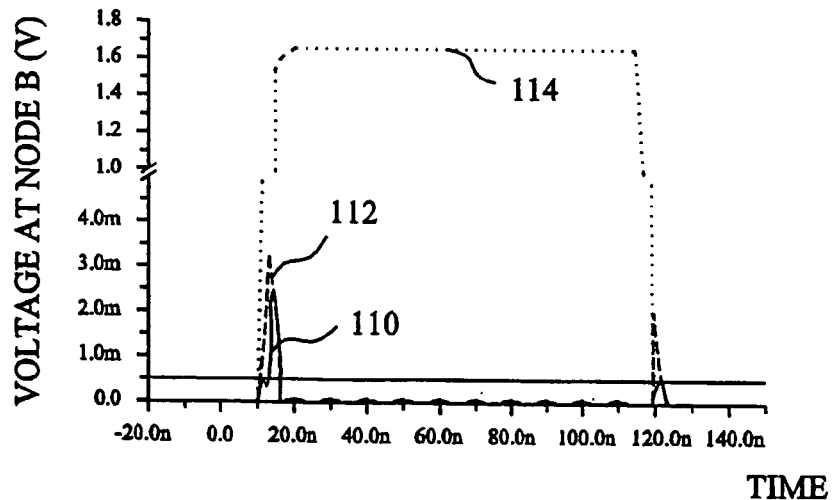

FIGS. 4a-4c show the waveform diagrams illustrating the bias voltages on the N-well 86 of the PMOS transistor 58, the currents from the pad 51 and the voltages on the node B measured under a same set of parameters. During normal operations, the pad 51 is applied with 0-3.3 V and 0-5 V, while during the ESD event, the pad 51 is applied with 0-8 V for basic parameters under the test. FIG. 4a shows the waveform diagram illustrating the bias voltage on the N-well 86 of the PMOS transistor 58, among which the curve 90 represents a waveform of the N-well 86 with 0-3.3 V applied to the pad 51 during normal operations, the curve 92 represents a waveform of the N-well 86 with 0-5 V applied to the pad 51 during normal operations, and the curve 94 represents a waveform of the N-well 86 with 0-8 V applied to the pad 51 during the ESD event. The curve 90 indicates that, during the normal operations, if the supply voltage VCC is larger than that on the pad 51, the bias voltage of the N-well 86 is the same as that applied by the supply voltage VCC. While the supply voltage VCC is smaller than that on the pad 51 during normal operations, the curve 92 indicates that, the bias voltage on the N-well 86 is the same as that applied by the voltage on the pad 51. FIG. 4b shows the waveform diagrams illustrating the currents from the pad 51, among which curve 100 represents a waveform of the current from the pad 51 with 0-3.3 V applied to the pad 51 during normal operations, curve 102 represents a waveform of the current from the pad 51 with 0-5 V applied to the pad 51 during normal operations, and curve 104 represents a waveform of the current from the pad 51 with 0-8 V applied to the pad 51 during the ESD event. The leakage currents from the pad 51 in the curves 100 and 102 are rather small, and no substantially large leakage current is caused when the voltage applied to the pad 51 is larger than that applied by the supply voltage VCC. FIG. 4c shows the waveform diagram illustrating the voltage $V_B$ on the node B, among which curve 110 represents the waveform of the voltage on the node B with 0-3.3 V applied to the pad 51 during normal operations, curve 112 represents the waveform of the voltage on the node B with 0-5 V applied to the pad 51 during normal operations, and curve 114 represents the waveform of the voltage on the node B with 0-8 V applied to the pad 51 during the ESD event. During normal operations, the NMOS transistor 68 is turned on to clamp the voltage $V_B$ on the node B and to discharge rapidly to ground GND. Due to the voltage $V_B$ on the node B kept at low potential, the ESD protection device 52 is prevented from being triggered. While to the ESD event, the voltage $V_B$ on the node B is pulled to high, and thus the emitter-base junction of the ESD protection device 52 is forward biased, thereby enhancing the fingers of the ESD protection device 52 to be easily triggered.

Illustrated by the foregoing description, the inventive ESD protection structure and method utilizing substrate triggering for a high-voltage tolerant pad enables the pad 51 to be applied higher voltages than the supply voltage VCC. In addition, the active device to form the inventive ESD protection structure needs small chip size and reduces the loading on the pad.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An electrostatic discharge (ESD) protection method for an integrated circuit, the method comprising the steps of:
   connecting an ESD protection device between a pad and a ground of the integrated circuit;
   arrangingconnecting a substrate-triggering control circuit including an active device connected between the pad and a substrate of the integrated circuit, whereby the active device is off during a normal operation of the integrated circuit, so a potential of the substrate stays at a low level, thereby keeping the ESD protection device off during the normal operation;
   turning the active device off during a normal operation for keeping the substrate at a low voltage; and
   turning the active device on during an ESD event for pumping the substrate to a high voltage;
   upon the occurrence of an ESD event of the integrated circuit, turning on the active device, thereby increasing the potential of the substrate to a high level; and
   when the potential of the substrate reaches the high level, releasing electrostatic charge of the integrated circuit by turning on the ESD protection device.

2. The method of claim 1, further comprising detecting a voltage on the pad with a detector to determine whether the integrated circuit is in the normal operation or in the ESD event.

3. The method of claim 1, further comprising connecting a discharging circuit between the substrate and the ground for establishing a discharge path for the substrate.

4. The method of claim 1, further comprising applying a bias voltage using a supply voltage source to a well containing the active device during the normal operation, for suppressing a leakage current of the active device, and enabling the pad to endure a voltage higher than supply voltage of the supply voltage source.

5. An ESD protection method for an integrated circuit, comprising:
   providing a low voltage to a substrate of the integrated circuit during a normal operation; and
   increasing the voltage of the substrate during an ESD event, by injecting a current into a substrate resistor imparted by the substrate;
   wherein the current is injected by an ESD circuit from a pad of the integrated circuit, the ESD circuit being turned on by an active device coupled between the pad and the substrate.

6. The method of claim 5, wherein the active device is a first active device, and a gate voltage is applied to a gate of the first active device by turning on a second active device with an induced voltage in response to the ESD event, wherein a drain of the second active device is connected to the gate of the first active device, and a source of the second active device is connected to the pad.

7. The method of claim 5, further comprising applying a bias voltage using a supply voltage source to a well containing the active device during the normal operation, for suppressing a leakage current of the active device and enabling the pad to endure a voltage larger than the supply voltage of said source.

8. The method of claim 7, wherein the active device is a first active device, and the bias voltage is applied to the well by turning on a second active device when a voltage is applied on the pad, wherein a source of the second active device is connected to the supply voltage, a gate the second active device is connected to the pad, and a drain of the second active device is connected to the well.

* * * * *

UNITED STATES PATENT AND TRADEMARK OFFICE
CERTIFICATE OF CORRECTION

PATENT NO. : 7,573,102 B2  Page 1 of 1
APPLICATION NO. : 11/496490
DATED : August 11, 2009
INVENTOR(S) : Meng-Huang Liu et al.

It is certified that error appears in the above-identified patent and that said Letters Patent is hereby corrected as shown below:

Title page, add item (62)    Related U.S. Application Data
Division of application No. 10/854,792, filed on May 27, 2004, now Pat. No. 7,193,274.

Title page, add item (30)    Foreign Application Priority Data
Sep. 3, 2003  (TW) ........................... 092124326

Signed and Sealed this

Twenty-ninth Day of September, 2009

David J. Kappos
*Director of the United States Patent and Trademark Office*